(12) United States Patent
Khlat

(10) Patent No.: US 6,873,218 B2
(45) Date of Patent: Mar. 29, 2005

(54) FREQUENCY MODULATOR USING A WAVEFORM GENERATOR

(75) Inventor: Nadim Khlat, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/343,531

(22) PCT Filed: Jul. 16, 2001

(86) PCT No.: PCT/EP01/08157

§ 371 (c)(1), (2), (4) Date: Jan. 31, 2003

(87) PCT Pub. No.: WO02/13369

PCT Pub. Date: Feb. 14, 2002

(65) Prior Publication Data

US 2004/0090909 A1 May 13, 2004

(51) Int. Cl.[7] ................................. H03C 3/00
(52) U.S. Cl. ................. 332/103; 332/104; 375/302; 375/305; 375/274
(58) Field of Search ................. 332/103, 144; 375/302, 305, 274

(56) References Cited

U.S. PATENT DOCUMENTS

| | | | |
|---|---|---|---|
| 5,107,520 A | 4/1992 | Karam | |
| 5,548,541 A | 8/1996 | Bierman | |
| 5,648,987 A | 7/1997 | Yang | |
| 5,805,480 A | 9/1998 | Greenberg | |
| 5,825,257 A | * 10/1998 | Klymyshyn et al. | ........ 332/100 |
| 6,420,940 B1 | * 7/2002 | Minnis et al. | .............. 332/103 |

FOREIGN PATENT DOCUMENTS

| | | |
|---|---|---|
| EP | 0408238 B1 | 1/1991 |
| WO | WO 99/07065 A1 | 2/1999 |

* cited by examiner

Primary Examiner—Arnold Kinkead

(57) ABSTRACT

A Multi-mode Loop Frequency modulator (10) for modulating a carrier signal according to various modulation pulse shapings and data signal to provide a modulated output signal (VCOout), comprises a waveform generator (12) and two multiplexors (14,38) to perform various pulse shaping filtering and or predistord the pulse shaping filter impulse response for either a dual port modulation or for a single port modulation. The waveform generator (12) can also provide interpolation to input frequency deviation and also provide scaling for various reference frequency clock provided by the crystal (30) and the reference divider (28). The low pass filter (22) is used for providing the PLL loop filtering and also as the smoothing filter for the high port DAC (18).

12 Claims, 4 Drawing Sheets

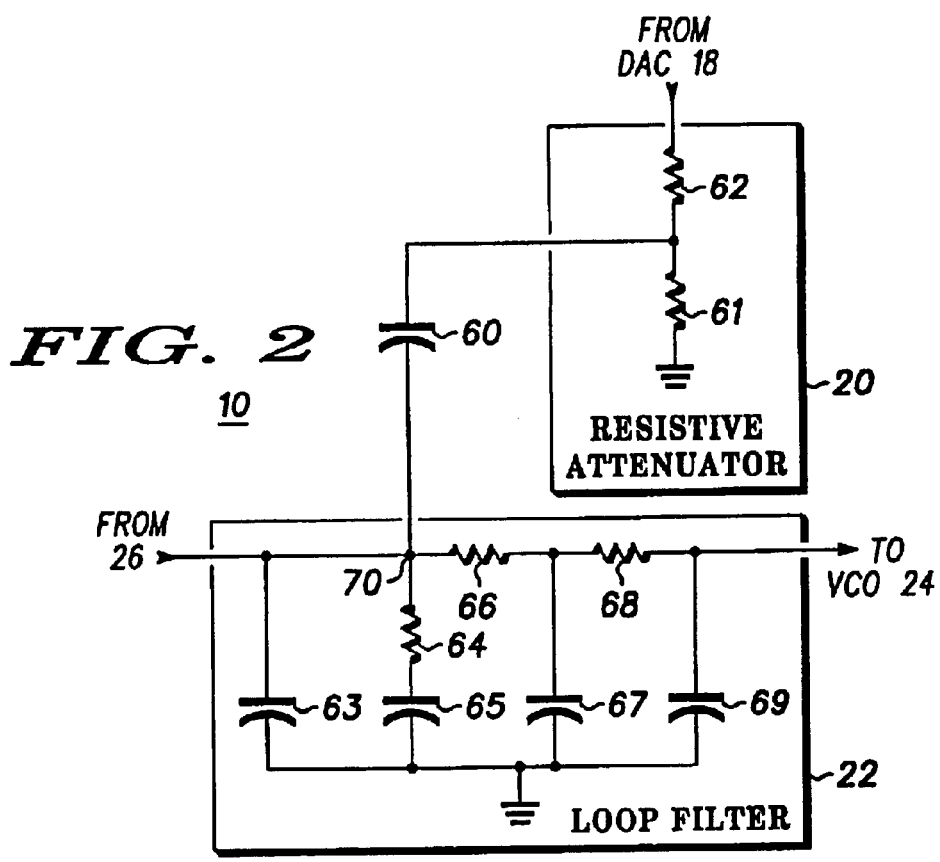
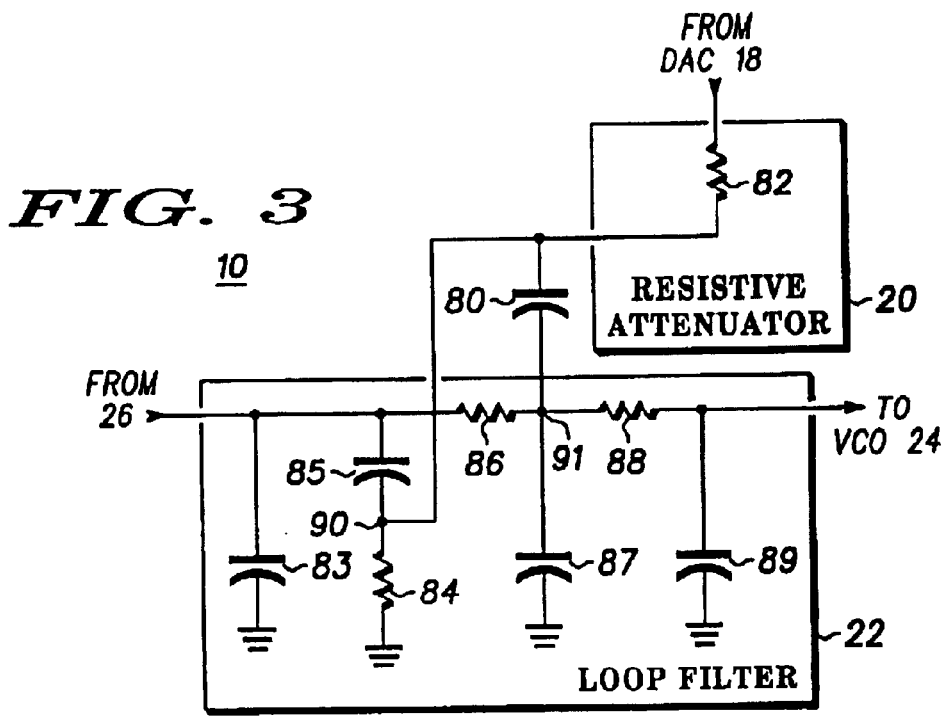

US 6,873,218 B2

FREQUENCY MODULATOR USING A WAVEFORM GENERATOR

FIELD OF THE INVENTION

This invention relates to a frequency modulator, and more particularly, to a frequency modulator using a waveform generator.

BACKGROUND OF THE INVENTION

Many digital radio communication systems, such as cellular, cordless and data transmission systems, use FSK, GFSK (Gaussian Frequency Shift Key), or GMSK (Gaussian Mean Shift Key) modulation techniques. These types of modulation techniques are in fact simply frequency modulation (FM) with the radio frequency (RF) signal envelope constant.

Since there is no amplitude modulation (AM) involved in these types of modulation techniques, the voltage controlled oscillator (VCO) frequency of the transmitters can be directly modulated by the baseband signal, as is typical in regular analog FM transmitters, such as in analog cellular systems. Significant cost reductions can be obtained by directly modulating the VCO frequency. Such arrangements are particularly desirable in digital applications where low cost is a strategic factor. For example, the overall cost of a digital solution such as DECT must be very low to be competitive with well known analog systems such as CT0.

In order to avoid any inter symbol interferences which could corrupt the eyes pattern and degrade the bit error rate of the transmission in the digital system, the amplitude transfer function and the group delay on the modulation path has to be kept constant across the entire spectrum of the baseband signal. This requires the transfer function of the phase lock loop (PLL) to be high enough to pass the entire modulation spectrum. Furthermore, in order to meet the applicable radio specifications, the spectral purity of the RF signal source to be transmitted should be maintained as near to the carrier signal as possible for phase noise and modulation accuracy, and should be maintained as far from the carrier signal as possible to reduce harmonics, the noise floor, and discrete spurious signals. As a consequence, the transfer function of the PLL must be low enough to filter the noise.

A technique called Dual Port modulation is known to provide the capability to generate a low port modulation signal as well as a high port modulation. The low port modulation signal is used to drive a noise shaping circuit that controls the divider of the PLL, while at the same time the high port frequency modulation signal is used as a input to a high port path which utilizes a digital to analog converter (DAC) to directly drive the input voltage of a voltage controlled oscillator (VCO). The effect of the dual port modulation is to provide a low pass transfer function for the generated noise of the reference clock and the noise shaping circuitry, and to provide an all pass function to the input frequency deviation.

Existing dual port modulation circuits have several problems. First, directly coupling the DAC output to the VCO input can produce noise at the output of the VCO. Second, a smoothing filter at the DAC ouput is needed in order to filter the analog output produced by the DAC. And third, several look-up tables are required to store the frequency deviation pulse shaping values for a given frequency modulation. Some frequency modulations require different crystal clocks to drive the PLL, or for a given crystal clock require different reference clock for the PLL, in order to provide different band ranges (e.g. private mobile radio systems). If the reference clock has to be modified, the number of look-up tables must be increased for various reference clocks, which then results in an increased system cost.

SUMMARY OF THE INVENTION

According to the Present Invention there is Provided

A frequency modulator (10) for modulating a carrier signal according to a modulation data signal (40) to provide a modulated output signal (41), the frequency modulator comprising:

A waveform generator (12) coupled to receive the modulation data signal for predistorting the modulation data signal In a selected manner to provide at least one predistorted modulation data signal (54, 56); and A circuit (11) coupled to receive the at least one predistorted modulation data signal for generating and providing the modulated output signal at an output.

BRIEF DESCRIPTION OF THE DRAWINGS

A frequency modulator in accordance with the present invention will now be described, by way of example only, with reference to the accompanying drawings in which:

FIG. 2 is a schematic diagram of one embodiment of a resistive attenuator 20 and loop filter 22 of FIG. 1 in accordance with one embodiment of the present invention;

FIG. 3 is a schematic diagram of an alternate embodiment of a resistive attenuator 20 and loop filter 22 of FIG. 1 in accordance with one embodiment of the present invention.

DETAILED DESCRIPTION OF EMBODIMENTS OF THE INVENTION

Description of the Drawings

Figure 1:
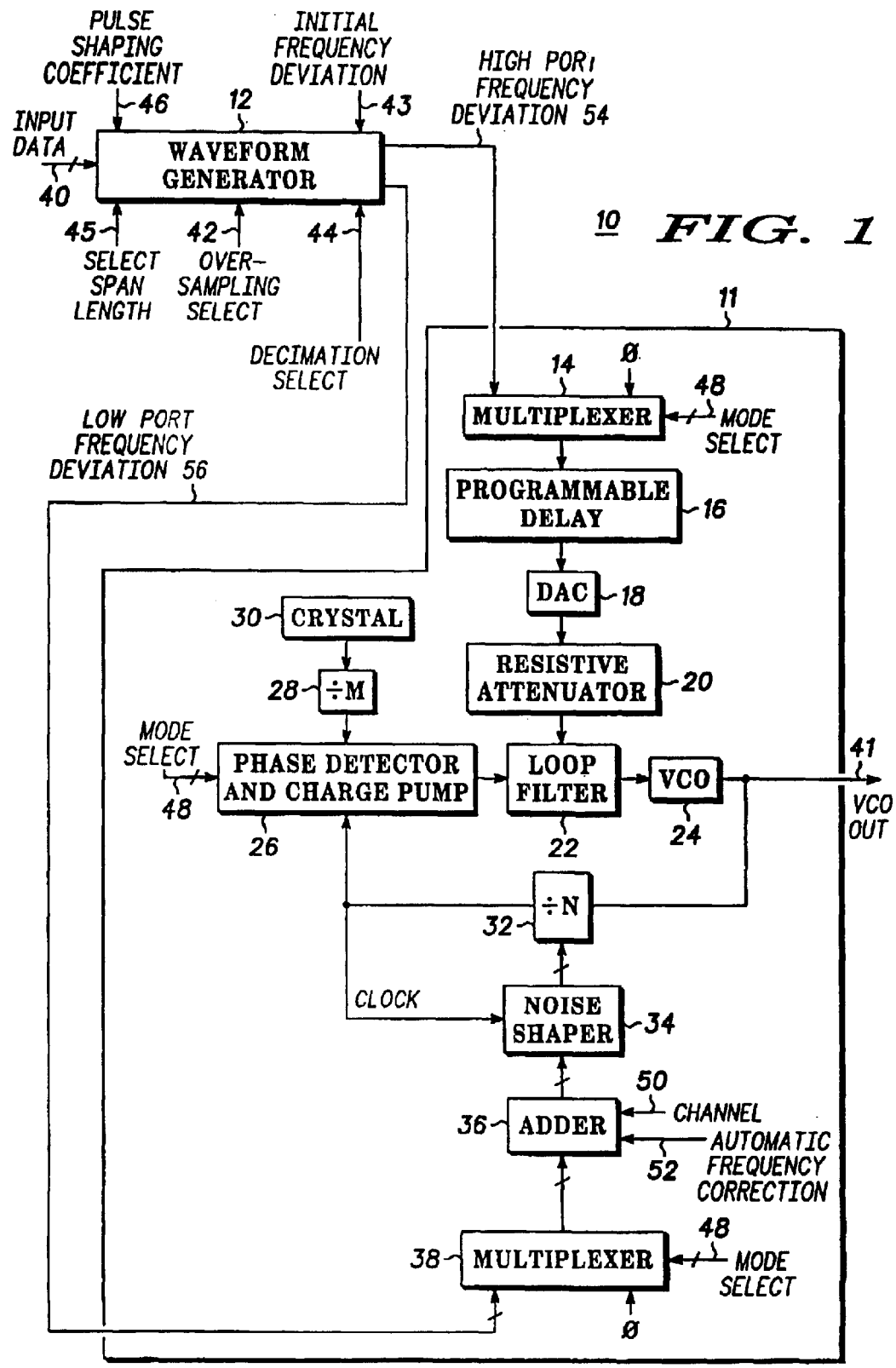
FIG. 1 is a block diagram of a multi-mode loop FM modulator in accordance with one embodiment of the present invention.

FIG. 1 illustrates one embodiment of a multi-mode loop FM modulator 10. In one embodiment of the present invention an FM waveform generator 12 receives an initial frequency deviation 43 which is used to provide an initial frequency deviation value. FM waveform generator 12 also receives input date by way of input data port 40. Select span length 45 oversampling select 42, decimation select 44 and pulse shaping coefficient input 46 are used to provide control and select information to FM waveform generator 12. FM waveform generator 12 is used to generate a high port frequency deviation signal 54 which is provided to a first input of multiplexer 14 a zero frequency input signal is provided as the second input to multiplexer 14. Mode select signal 48 is provided to select which input of multiplexer 14 is provided to programmable delay circuit 16. The mechanism by which programmable delay circuit is programmed may be software or hardware (not shown). The output of programmable delay circuit 16 is coupled to an input of digital to analog converter (DAC)18. In some embodiments of the present invention the gain of DAC 18 maybe programmable. The output of DAC 18 is provided to resistive attenuator 20 the output of resistive attenuator 20 is provided to loop filter 22. The output of loop filter 22 is provided to voltage controlled oscillator (VCO) 24. The output of VCO 24 is a signal called VCO output 41 which is the output of multimode loop FM modulator 10. The VCO output signal 41 is also provided to an input of divider 32 in one embodiment of the present invention divider 32 may divide the VCO output signal 41 by a programmable value N. The value of N may be provided in software of hardware to divider 32 (not shown). The output of divider 32 is provided to both noise shaper 34 and phase detector and charge pump circuit 26. Noise shaper 34 uses the output of divider 32 as a clock signal. In one embodiment of the present invention noise shaper 34 uses the clock to clock one or more accumulators within noise shaper 34. Phase detector and charge pump 26 receives a signal from divider circuit 28. Divider circuit 28 receives a signal from a crystal 30 phase detector and charge pump circuit 26 also receives a mode select signal 48 which is used to turn the charge pump on or off. The output of phase detector and charge pump circuit 26 is provided to loop filter 22.

A second output of FM waveform generator 12 is low port frequency deviation 56. Low port frequency deviation 56 is provided an input to multiplexer 38 multiplexer 38 also receives as an input a zero frequency signal. Mode select is provided to multiplexer 38 as a select signal to select which input is provided as an output by multiplexer 38 to adder 36. Adder 36 also receives a channel input 50 and an automatic frequency correction for crystal input 52. A channel input 50 may be used to change the channel on which VCO output 41 has provided. The automatic frequency correction for crystal input 52 may be an input added to adder 36 to compensate for deviations between crystal 30's nominal frequency and its actual frequency. The output of adder 36 is provided to noise shaper circuit 34.

FIG. 2 illustrates one embodiment of resistive attenuator 20 and loop filter 22 of FIG. 1. In one embodiment resistive attenuator 20 includes resistor 62 and resistor 61. A first terminal of resistor 61 is coupled to a first terminal of resistor 62 and a first terminal of capacitor 60. A second terminal of resistor 62 is coupled to receive the output from DAC 18. A second terminal of resistor 61 is coupled to a first power supply voltage. In one embodiment of the present invention this first power supply voltage is approximately ground. A second terminal of capacitor 60 is coupled to a node 70. Node 70 is also coupled to phase detector and charge pump circuit 26 a first terminal of capacitor 63 a first terminal of resistor 64 and a first terminal of resistor 66. A second terminal of resistor 66 is coupled to a first terminal of resistor 68 and a first terminal of capacitor 67. A second terminal of resistor 68 is coupled to a first terminal of capacitor 69 and is also provided to VCO 24 as an input. A second terminal of resistor 64 is coupled to a first terminal of capacitor 65. A second terminal of capacitor 63 a second terminal of capacitor 65 a second terminal of capacitor 67 and a second terminal of capacitor 69 are all coupled to a first power supply voltage.

FIG. 3 illustrates an alternate embodiment of resistor attenuator 20 and loop filter 22 of FIG. 1. Resistor attenuator 20 includes resistor 82. A first terminal of resistor 82 is provided from the output of DAC 18. A second terminal of resistor 82 is coupled to a first terminal of capacitor 80 a first terminal of resistor 84 and a second terminal of capacitor 85. A second terminal of resistor 84 is coupled to the first power supply voltage. The first terminal of capacitor 85 is coupled to a first terminal of capacitor 83 and a first terminal of resistor 86. A second terminal of capacitor 83 is coupled to the first power supply voltage. The second terminal of resistor 86 is coupled to node 91. Node 91 is also coupled to a first terminal of capacitor 87 and a first terminal of resistor 88. The second terminal of resistor 88 is coupled to a first terminal of capacitor 89 and is provided to VCO 24. A second terminal of capacitor 87 and a second terminal of capacitor 89 are both coupled to the first power supply voltage. The first terminal of capacitor 83 is coupled to phase detector and charge pump circuit 26. The second terminal of capacitor 80 is coupled to node 91.

Figure 4:
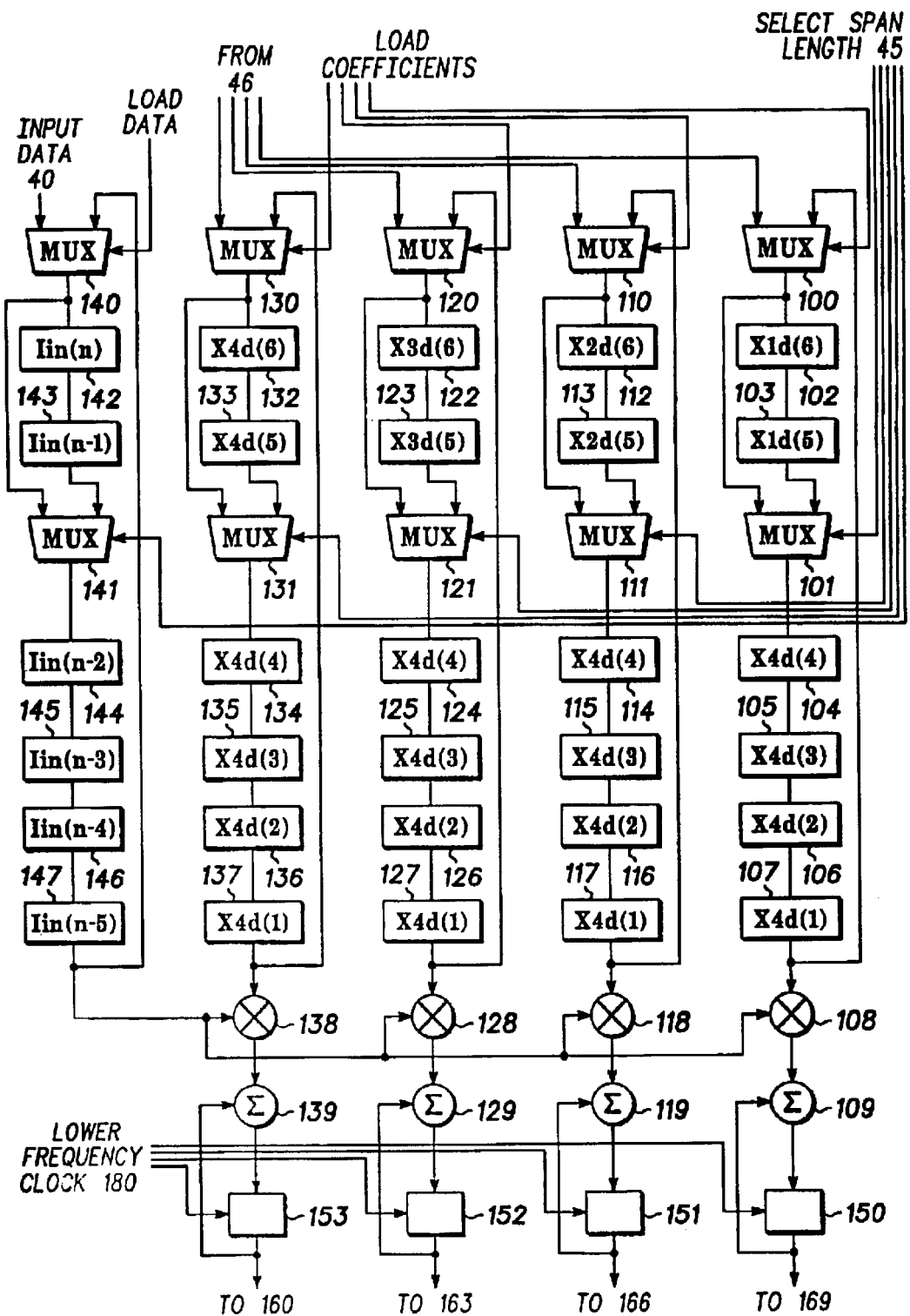
FIG. 4 is a block diagram of a waveform generator 12 of FIG. 1 in accordance with one embodiment of the present invention.
Figure 5:
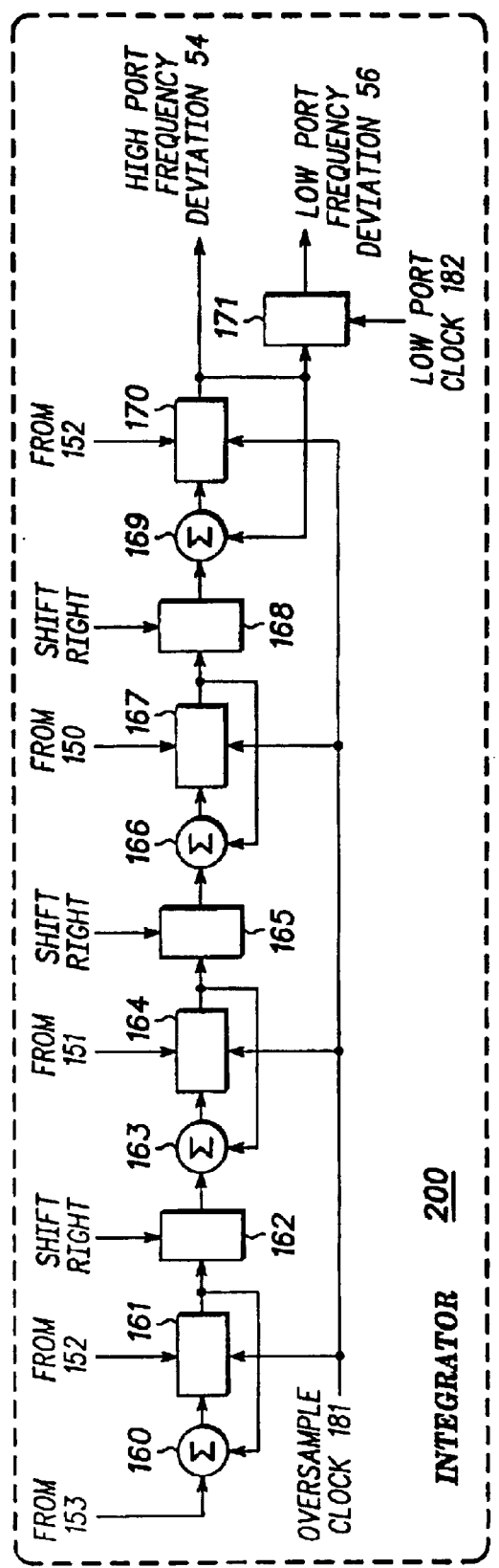
FIG. 5 is a block diagram of an integrator 200 in accordance with one embodiment of the present invention.

FIG. 3 illustrates a portion of FM waveform generator 12. Although FIG. 4 illustrates a fourth order system alternate embodiments of the present invention may use any order system. In the embodiment of the present invention illustrates in FIG. 4 the first order derivative is generated by the circuitry 100–109 and 150. Multiplexer 100 is used to determine whether the coefficients are loaded from pulse shaping coefficient input 46 or from the feedback output provided at the output of storage circuit 107. In one embodiment of the present invention storage circuits 102–107 are used to store the coefficients of the first order of derivative of the impulse response of the pulse-shaping filter. Multiplier 108 multiplies the coefficient value by the input data value provided at the output of storage circuit 147. The output of multiplier 108 is provided to a symation circuit 109. The output of symation circuit 109 is provided to a storage circuit 150. The output of storage circuit 150 is fed back as one of the addition inputs to the symation circuit 109. The output of storage circuit 150 is also provided to storage circuit 167.

In one embodiment of the present invention symation circuit 109 and storage circuit 150 are performing an accumulation function. (Sue fill in for second, third and fourth order derivatives).

Input data 40 is provided as one input to multiplexer 140 a low data select input of the multiplexer 140 selects whether input data 40 is provided at the output of the multiplexer or whether the feedback path from storage circuit 147 is provided at the output of multiplexer 140. The output of multiplexer 140 is coupled to storage circuit 142. The output of storage circuit 142 is coupled to the input of storage circuit 143. The output of storage circuit 143 is couple to a first input of multiplexer 141. A second input of multiplexer 141 is coupled to the output of multiplexer 140. The output of multiplexer 141 is coupled to the input of storage circuit 144. The output of storage circuit 144 is coupled to the input of storage circuit 145. The output of storage circuit 145 is coupled to the input of storage circuit 146. The output of storage circuit 146 is coupled to the input of storage circuit 147. The output of storage circuit 147 is coupled to an input of multiplexer 140, and to multipliers 138, 128, 118 and 108. Note that although the illustrated embodiment in FIG. 4 allows at the select stand length to be selected as either 4 or 6 alternate embodiments of the present invention may use more or fewer multiplexers to allow the select stand length to be varied in any manner.

DESCRIPTION OF OPERATION

Referring to FIG. 1, using a waveform generator 12 within an FM modulator 10 allows different and programmable pulse shaping filters to be used for various frequency modulation schemes. For example, waveform generator 12 may be used to predistort the overall dual port transfer function such that the combined predistortion and the dual port transfer function have a reduced ripple in gain and in phase over frequency. Note that FM waveform generator 12 can be used to do just interpolation, or can alternately be used to do filtering as well as interpolation. If waveform generator 12 is used to do just interpolation, then another integrated circuit such as a digital signal processor (not shown) may be used to do the filtering and may provide input data 40 to waveform generator 12.

The prior art methods often used a look-up table to perform interpolation. The use of waveform generator 12 allows a significant amount of flexibility which the prior art look-up table did not allow. Waveform generator 12 can be used to predistort the input signal to both the high port (high port frequency deviation signal 54) and the low port (low port frequency deviation signal 56). The output of waveform generator 12 may be scaled as a function of the reference frequency. This can be used to adjust for the use of crystals of different frequencies or for a change in the value M of divider 28. This scaling is accomplished by selecting different coefficients for waveform generator 12 at the pulse shaping coefficient input 46. Note that the proper selection of the pulse shaping coefficient values at input 46 in conjunction with the proper selecting of the oversampling select value at input 42 can be used by waveform generator 12 to interpolate values between the input data values provided at input 40. The oversampling select input 42 may be used to select how many points are interpolated between each pair of input data values provided at input 40.

Another feature of the present invention is that the output of DAC 18 is filtered by loop filter 22. In prior art methods, the output of DAC 18 bypassed loop filter 22 and was provided directly to the input of VCO 24. In one embodiment of the present invention, the output of DAC 18 is provided to loop filter 22 by way of resistive attenuator 20, and thus the output of DAC 18 is now filtered. As a result, loop filter 22 now provides a dual function in that it filters the input signal to VCO 24 as well as filtering the output of DAC 18.

In one embodiment of the present invention the high port frequency deviation 54 and the low port frequency deviation 56 are related to each other in that low port frequency deviation 56 is a decimation of the high port frequency deviation 54. The decimation relationship between the high port frequency deviation 54 and the low port frequency deviation 56 may be programmed by way of the decimation select input 44 to waveform generator 12.

FIGS. 2 and 3 illustrate alternate ways in which DAC 18 may be coupled to loop filter 22. In addition, the specific circuits of resistive attenuator 20 and loop filter 22 may be implemented in a variety of ways. What is important is that loop filter 22 now provides at least some filtering of the output of DAC 18 If DAC 18 is coupled directly to the input of VCO 24 and by-passes loop filter 22, then more noise is generated at VCO output 41. In one embodiment, the present invention couples the output of DAC 18 to some point within loop filter 22 so that loop filter 22 serves a dual purpose of filtering the output of DAC 18 as well as filtering the signal provided by phase detector and charge pump 26.

Alternate embodiments of the present invention may couple DAC 18 to loop filter 22 in a variety of ways. For example, The circuit illustrated in FIG. 3 allows resistor 61 (see FIG. 2) to be removed because resistor 84 within loop filter 22 serves a similar attenuation function. Although FIG. 2 and FIG. 3 have been shown as alternate embodiments for coupling DAC 18 to loop filter 22, there may be a variety of ways in which the coupling can take place. Note that capacitor 60 has been added to the circuit in FIG. 2 in order to couple the resistive attenuator 20 and loop filter 22. In a similar manner capacitor 80 has been added to the circuit in FIG. 3 to couple resistive attenuator 20 to loop filter 22. Again, note that alternate embodiments of the present invention may couple DAC 18 to loop filter in many different ways.

By coupling DAC 18 to VCO 24 by way of loop filter 22, the transfer function of FM modulator 10 is no longer constant over frequency. This now presents a problem that can be solved by waveform generator 12. Waveform generator 12 may be programmed by way of pulse shaping coefficients provided at input 46 to predistort the transfer function in such a way that the distortions caused by the direct coupling of DAC 18 and loop filter 22 are significantly reduced. This is another example of the flexibility provided by adding waveform generator 12 to FM modulator 10.

Note that the waveform generator 12 can also be used to perform a filtering function in order to reduce the sensitivity of FM modulator 10 to variations in the gain of VCO 24. This filtering performed by waveform generator 12 could be performed by any type of linear phase filter, such as, for example, a Bessel filter. Note that this linear phase filtering is in addition to the predistortion and the pulse shaping filtering which are also performed by waveform generator 12. In one embodiment of the present invention, the linear phase filtering, the predistortion, and the pulse-shaping filtering can all be performed using one filter within wave form generator 12. Alternate embodiments of the present invention may instead implement multiple filters within waveform generator 12. In addition, alternate embodiments of the present invention may perform fewer, more, or different filtering and wave shaping functions within waveform generator 12.

The following several paragraphs describe how the linear phase filtering, the predistortion, and the pulse-shaping filtering can all be performed using one filter within wave form generator 12.

We can express the VCO output frequency Fout versus the input frequency deviation Fin for the general case of Dual Port as:

$$Gcl, dp(s) = \frac{Fout}{Fin} \quad \text{(equation 1)}$$

$$= \frac{[Kdacatt * Vhpf(s) * Kv] + [(Icp * Zlpf(s) * Kv)/(S*N)]}{1 + [(Icp * Zlpf(s) * Kv)/(S*N)]}$$

where Kv is the VCO slope expressed as Mhz/V unit.

Where N is the divider 32 programmed value.

Where Icp is the charge pump 26 current value expressed in mA.

Where Kdacatt is the gain of the DAC 18 and the attenuator 20.

Where Zlpf(s) is the loop filter low port impedance transfer function between the the output of the charge pump 26 and the output of the loop filter 22 expressed in V/mA Where Vhpf(s) is the loop filter high port transfer function between the output of the attenuator 20 and the output of the loop filter 22 expressed in V/V.

Where s is the Laplace transform variable.

In order to have equation 1 to be constant over frequency, this requires that Kdacatt*Vhpf(s)*Kv=1 over the signal useful spectrum (equation 2).

Please note that in the ideal dual port where adding directly at the VCO input would result having Vhpf(s)=1, then Kdacatt*Kv=1 is required which do not depend on frequency.

Equation 2 cannot be satisfied within the signal useful spectrum when Vhpf(s) is a function of the frequency. A possible solution would be to have a predistorsion within the high port path to compensate the Vhpf(s), however this will requires adding another programmable waveform generator to the high port on top of the waveform generator to the low port path.

A single waveform generator is used to drive both the high port and the low port by implementing the pulse shaping filter transfer function F(s) combined with a predistorsion transfer function Hpd(s), i.e F(s)*Hpd(s) where $Hpd(s)$ is an approximation of $\cong$ $$\frac{1 + [(Icp * Zlpf(s) * Kv)/(S * N)]}{[Kdacatt * Vhpf(s) * Kv] + [(Icp * Zlpf(s) * Kv)/(S * N)]}$$

the predistorsion transfer function can reduce overall gain ripple and group delay ripple, without eliminating totally this ripple since the predistorsion is done on both ports to avoid using two waveform generators.

One of the key advantages to using a waveform generator 12 with FM modulator 10 is that waveform generator 12 can be programmed in variety of ways to adjust the behaviour of modulator 10 based on various changes that are made within the circuit of modulator 10. Thus a designer of multi-mode loop FM modulator 10 now has a significant amount of flexibility in adjusting the filtering and interpolation that can be performed within the FM modulator 10. Note that alternate embodiments of the present invention may use both of multiplexers 14 and 38, may use just one of them, or may alternately use neither of them. Also, note that by having a zero input to multiplexer 14 and multiplexer 38, a user of FM modulator 10 can select a system in which VCO 24 is driven by the high port alone, the low port alone, or both the high port and low port together.

In an alternate embodiment, DAC 18 may by-pass loop filter 22 and may be coupled to the input of VCO 24 by way of an operational amplifier (not shown). However, one drawback to this approach is that an operational amplifier may add significant cost and noise to FM modulator 10. In addition, the output of DAC 18 is no longer filtered by loop filter 22.

FIG. 4 illustrates one embodiment of a portion of waveform generator 12 of FIG. 1. In the embodiment illustrates in FIG. 4, the select span length signal 45 selects whether storage circuits 102 and 103 are bypassed or not. Thus, select span length 45 determines whether the span length is selected to be 4 (using storage circuits 104–107,) or whether the span length is selected to be 6 (using storage circuits 102–107). Alternate embodiments of the present invention may use more multiplexers (e.g. 100,101), or multiplexers placed in different locations than that illustrates in FIG. 4. For example, an additional multiplexer, similar to multiplexer 101, may be coupled between storage circuit 105 and 106 in order to allow the select span length 45 to be selected to be 2,4, or 6. The span length determines the number of previous data input values that are used by the filter of waveform generator 12 at a given time. Various predetermined protocols require different span lengths. Thus, the waveform generator 12 illustrated in FIG. 4 may be used for a variety of these protocols since the span length is programmable.

An additional feature of waveform generator 12 is that multipliers 108, 118, 128, and 138 are operating at the input data rate multiplied by the selected span length as selected at input 45. The input data rate is the frequency at which input data is provided at input 40. It was common in the prior art to use a separate multiplier for each of the storage circuits (e.g. 102–107) in the span length. Thus, the present invention allows one multiplier to be used repeatedly at a higher clock frequency, while the prior art required multiple multipliers which operated at a lower clock frequency.

The present invention allows the oversampling rate to be programmable by changing the oversampling clock 181 and a shift number input to shifters 162, 165, and 168. Note that integrator circuit 200 performs an integration function where the last stage receives an initial frequency deviation value 43 which allows the FM modulator 10 to be set to a predetermined initial value. Integrator circuit 200 use the oversample clock 181 to integrate the derivatives of the input data 40. Integrator 200 generates and provides the high port frequency deviation signal 54 and the low port frequency deviation signal 56. The shift by N circuits 162,165 and 168 can be used to adjust for the difference between the oversampling clock and the input data rate. Note that by using a simple shift circuit, the assumption is made that the oversampling clock and the input data clock are related by a power of 2. The amount by which shift circuits 162, 165 and 168 are shifted can be a programmable value N. Note that the low port clock 182 provided at the input to storage circuit 171 can be used to perform the decimation function. Thus in one embodiment of the present invention, the low port frequency deviation signal is a decimation of the high port frequency deviation signal 54. Alternate embodiments of the present invention may do decimation in an alternate way, or may not use decimation at all. In other words only one out of X of the values of the high port frequency deviation signal 54 are actually provided and passed on through as part of the low port frequency deviation signal 56.

Although one embodiment of waveform generator 12 has been illustrated in FIG. 4, there are a wide variety of embodiments of waveform generators that may be used for the present invention. For example, although waveform generator 12 has been illustrated as being implemented primarily in hardware form, it is important to note that alternate embodiments of the present invention may more software and less hardware in implementing waveform generator 12.

What is claimed is:

1. A frequency modulator for modulating a carrier signal according to a modulation data signal to provide a modulated output signal, the frequency modulator comprising:
   a waveform generator coupled to receive the modulation data signal for predistorting the modulation data signal in a selected manner to provide at least one predistorted modulation data signal; and
   a circuit coupled to receive the least one predistorted modulation data signal for generating and providing the modulated output signal at an output;
wherein the at least one predistorted modulation data signal comprises a high port frequency deviation signal and a low port frequency deviation signal, and
the decimation ratio between the high port frequency deviation signal and the low port frequency deviation signal is programmable.

2. A frequency modulator according to claim 1 wherein the waveform generator performs Interpolation.

3. A frequency modulator according to claim 1 wherein the waveform generator performs filtering.

4. A frequency modulator for modulating a carrier signal according to a modulation data signal to provide a modulated output signal, the frequency modulator comprising:
   a waveform generator coupled to receive the modulation data signal for predistorting the modulation data signal in a selected manner to provide at least one predistorted modulation data signal; and a circuit coupled to receive the least one predistorted modulation data signal for generating and providing the modulated output signal at an output;

wherein a span length of the waveform generator is programmable.

5. A frequency modulator according to claim 1 wherein the waveform generator comprises at least one shift circuit to adjust for a difference between a frequency of the modulation data signal and a frequency of an oversampling clock.

6. A frequency modulator for modulating a carrier signal according to a modulation data signal to provide a modulated output signal, the frequency modulator comprising:

a waveform generator coupled to receive the modulation data signal for predistorting the modulation data signal in a selected manner to provide at least one predistorted modulation data signal; and a circuit coupled to receive the least one predistorted modulation data signal for generating and providing the modulated output signal at an output;

wherein the waveform generator has an oversampling rate which is programmable.

7. A frequency modulator for modulating a carrier signal according to a modulation data signal to provide a modulated output signal, the frequency modulator comprising:

a waveform generator coupled to receive the modulation data signal for predistorting the modulation data signal in a selected manner to provide at least one predistorted modulation data signal; and a circuit coupled to receive the least one predistorted modulation data signal for generating and providing the modulated output signal at an output;

wherein the waveform generator comprises a multiplier circuit operating at the frequency or the modulation data signal.

8. A frequency modulator for modulating a carrier signal according to a modulation data signal to provide a modulated output signal, the frequency modulator comprising:

a waveform generator coupled to receive the modulation data signal for predistorting the modulation data signal in a selected manner to provide at least one predistorted modulation data signal; and a circuit coupled to receive the least one predistorted modulation data signal for generating and providing the modulated output signal at an output;

wherein the waveform generator comprises at least one adder circuit operating at the frequency of an oversampling clock.

9. A frequency modulator according to claim 1 wherein the waveform generator is operable to scale the at least one predistorted modulation data signal as a function of a reference frequency.

10. A frequency modulator according to claim 1 wherein the circuit for generating and providing the modulated output signal comprises:

a loop filter; and a VCO, coupled to receive an Input from the loop filter, for generating the modulated output signal at an output of the VCO, wherein the high port frequency deviation signal affects the VCO by way of the loop filter.

11. A transmitter for a digital radio communication device having a transmit path comprising:

a frequency modulator comprising:
a loop filter; and
a VCO, coupled to receive an Input from the loop filter, for generating the modulated output signal at an output of the VCO,
wherein a high port frequency deviation signal affects the VCO by way of the loop filter;

the frequency modulator for modulating a carrier signal according to a modulation data signal to provide a modulated output signal, the frequency modulator comprising a waveform generator coupled to receive the modulation data signal for predistorting the modulation data signal in a selected manner to provide at least one predistorted modulation data signal;

a power amplifier for amplifying the modulated output signal; and an antenna coupled to the power amplifier.

12. A transceiver for a digital radio communication device having a transmit path and a receive path, the transmit path comprising:

a frequency modulator comprising:
a loop filter; and
a VCO, coupled to receive an Input from the loop filter, for generating the modulated output signal at an output of the VCO,
wherein a high port frequency deviation signal affects the VCO by way of the loop filter;

the frequency modulator for modulating a carrier signal according to a modulation data signal to provide a modulated output signal, the frequency modulator comprising a waveform generator coupled to receive the modulation data signal for predistorting the modulation data signal in a selected manner to provide at least one predistorted modulation data signal; and a power amplifier for amplifying the modulated output signal and an antenna for coupling to the power amplifier.

* * * * *